United States Patent
Jung et al.

(10) Patent No.: US 12,224,719 B2
(45) Date of Patent: Feb. 11, 2025

(54) SIGNAL PROCESSING DEVICE AND IMAGE DISPLAY APPARATUS INCLUDING THE SAME

(71) Applicant: LG ELECTRONICS INC., Seoul (KR)

(72) Inventors: Youngjae Jung, Seoul (KR); Sungwoong Kim, Seoul (KR); Wooseong Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 240 days.

(21) Appl. No.: 17/802,854

(22) PCT Filed: Feb. 28, 2020

(86) PCT No.: PCT/KR2020/002876
§ 371 (c)(1),
(2) Date: Aug. 26, 2022

(87) PCT Pub. No.: WO2021/172630
PCT Pub. Date: Sep. 2, 2021

(65) Prior Publication Data
US 2023/0283246 A1     Sep. 7, 2023

(51) Int. Cl.
*H03F 3/183* (2006.01)
(52) U.S. Cl.
CPC ......... *H03F 3/183* (2013.01); *H03F 2200/03* (2013.01)
(58) Field of Classification Search
CPC .............................. H03F 3/183; H03F 2200/03
USPC ........... 381/94.5, 94.1, 120, 123; 330/51, 10
See application file for complete search history.

(56) References Cited

U.S. PATENT DOCUMENTS 9,832,563 B2 * 11/2017 Lee ...................... H04R 1/1091
2005/0285671 A1    12/2005 Chang et al.
2009/0196435 A1 *  8/2009 Miao ................... H03F 3/45475
                                                    381/94.5
2010/0321112 A1    12/2010 Fan et al.

FOREIGN PATENT DOCUMENTS

JP       2002-354571 A    12/2002
JP       2007-214633 A     8/2007
KR    10-2013-0006424 A     1/2013

* cited by examiner

*Primary Examiner* — Vivian C Chin
*Assistant Examiner* — Con P Tran
(74) *Attorney, Agent, or Firm* — Birch, Stewart, Kolasch & Birch, LLP

(57) ABSTRACT

Disclosed are a signal processing device and an image display apparatus including the same. The signal processing device includes an amplifier to perform amplification based on an input differential signal, an output driver to output an audio output signal based on an output signal from the amplifier, a reference voltage output device to output a reference voltage in response to power ON, a pre-output driver configured to pre-compensate for an offset voltage and output a compensation signal, based on an output signal from the amplifier after the power ON, and a first switching device disposed between an output terminal of the output driver and an output terminal of the pre-output driver, wherein the output driver operates after the first switching device is turned on in response to the power ON. Accordingly, pop noise and harmonic distortion in case in which power is turned on may be reduced.

18 Claims, 13 Drawing Sheets

SIGNAL PROCESSING DEVICE AND IMAGE DISPLAY APPARATUS INCLUDING THE SAME

CROSS REFERENCE TO RELATED APPLICATIONS

This application is the National Stage filing under 35 U.S.C. 371 of International Application No. PCT/KR2020/002876, filed on Feb. 28, 2020, which is hereby expressly incorporated by reference into the present application.

BACKGROUND

1. Field of the Disclosure

The present disclosure relates to an image display apparatus, and more particularly, to a signal processing device capable of reducing pop noise and harmonic distortion in case in which power is turned on, and an image display apparatus having the same.

2. Description of the Related Art

A signal processing device is a device that is provided in various electric appliances to process an audio signal.

In particular, when the signal processing device is provided in an image display apparatus, the signal processing device may perform image signal processing and audio signal processing together or separately.

Meanwhile, when users listen to music with their ears using headphones or speakers, unwanted noise may occur instantaneously according to an ON/OFF of power.

Such noise is called POP noise. Meanwhile, the pop noise may be output in a form other than an audio form.

This pop noise is due to an instantaneous voltage change or instantaneous current change in case in which power is turned on or off, and it is difficult to completely remove such pop noise, and therefore, recently, a technique of suppressing pop noise to a level that is inaudible to the human ear has been used.

SUMMARY

An object of the present disclosure is to provide a signal processing device and an image display apparatus including the same capable of reducing pop noise and harmonic distortion in case in which power is turned on.

Another object of the present disclosure is to provide a signal processing device and an image display apparatus including the same capable of reducing pop noise in case in which power is turned on and reducing a circuit size.

In order to achieve the above objects, there are provided a signal processing device and an image display apparatus including the same include: an amplifier configured to perform amplification based on an input differential signal; an output driver configured to output an audio output signal based on an output signal from the amplifier; a reference voltage output device configured to output a reference voltage in response to power ON; a pre-output driver configured to pre-compensate for an offset voltage and output a compensation signal, based on an output signal from the amplifier after the power ON; and a first switching device disposed between an output terminal of the output driver and an output terminal of the pre-output driver, wherein the output driver operates after the first switching device is turned on in response to the power ON.

Meanwhile, in response to the power ON, the output driver may operate after a ramp-ON operation of the first switching device.

Meanwhile, after a level of the reference voltage output from the reference voltage output device increases in response to the power ON, a first gate driving signal input to a gate terminal of the first switching device may include a first level increase period in which the voltage increases to a first level, a first level maintaining period in which the first level is maintained, and a second level maintaining period in which a second level greater than the first level is maintained.

Meanwhile, during the first level maintaining period, a level of the compensation signal output from the pre-output driver may be less than a level of the audio output signal output from the output driver, and during the second level maintaining period, a level of the compensation signal output from the pre-output driver may be the same as the level of the audio output signal output from the output driver.

Meanwhile, as the level of the reference voltage output from the reference voltage output device increases in response to the power ON, the level of the compensation signal output from the pre-output driver may increase.

Meanwhile, the signal processing device and the image display apparatus having the same according to an embodiment of the present disclosure may further include a second switching device connected to an input terminal of an output driver, wherein after the first switching device is turned on in response to the power ON, the second switching device may be turned on and the differential signal may be transmitted to the amplifier, and the output driver may output the audio output signal based on an output signal from the amplifier output based on an amplification operation of the amplifier.

Meanwhile, in response to ramp-ON of the second switching device, the output driver may operate.

Meanwhile, a level of the reference voltage output from the reference voltage output device may increase in response to the power ON, and after the first switching device is turned on, a second gate driving signal input to a gate terminal of the second switching device may include a first level increase period in which the voltage increases to a first level, a first level maintaining period in which the first level is maintained, and a second level maintaining period in which a second level greater than the first level is maintained.

Meanwhile, the second level maintaining period of the second switching device may be longer than the second level maintaining period of the first switching device.

Meanwhile, during the second level maintaining period of the second gate driving signal, the output driver may output a level-variable audio output signal, and during the first level maintaining period of the second gate driving signal, the output driver may not output the level-variable audio output signal.

Meanwhile, the signal processing device and the image display apparatus having the same according to an embodiment of the present disclosure may further include an ON-OFF controller configured to output a driving control signal to each of the amplifier, the output driver, and the pre-output driver in case in which power is ON or in case in which power is OFF.

Meanwhile, the signal processing device and the image display apparatus having the same according to an embodiment of the present disclosure may further include a first resistor disposed between the output driver and a first input terminal of the amplifier; and a second resistor disposed between the pre-output driver and a second input terminal of the amplifier.

Meanwhile, the signal processing device and the image display apparatus having the same according to an embodiment of the present disclosure may further include: a first resistor disposed between the output driver and a first input terminal of the amplifier; and a second resistor and a third switching device disposed between the pre-output driver and a second input terminal of the amplifier.

Meanwhile, the signal processing device and the image display apparatus having the same according to an embodiment of the present disclosure may further include: a reference voltage output device configured to output a reference voltage to a second input terminal, among a first input terminal and the second input terminal of the amplifier.

Meanwhile, the signal processing device and the image display apparatus having the same according to an embodiment of the present disclosure may further include: a ramp signal generator configured to generate and output a ramp signal; and a fourth switching device disposed between the ramp signal generator and the first switching device and configured to perform switching for a first gate driving signal input to a gate terminal of the first switching device sequentially having a first level and a second level greater than the first level.

Meanwhile, the signal processing device and the image display apparatus having the same according to an embodiment of the present disclosure may further include: a ramp signal generator configured to generate and output a ramp signal; and a fifth switching device disposed between the ramp signal generator and the second switching device and configured to perform switching for a second gate driving signal input to a gate terminal of the second switching device sequentially having a first level and a second level greater than the first level.

Effect of the Disclosure

A signal processing device and an image display apparatus including the same include: an amplifier configured to perform amplification based on an input differential signal; an output driver configured to output an audio output signal based on an output signal from the amplifier; a reference voltage output device configured to output a reference voltage in response to power ON; a pre-output driver configured to pre-compensate for an offset voltage and output a compensation signal, based on an output signal from the amplifier after the power ON; and a first switching device disposed between an output terminal of the output driver and an output terminal of the pre-output driver, wherein the output driver operates after the first switching device is turned on in response to the power ON. Accordingly, it is possible to reduce pop noise and harmonic distortion in case in which power is ON. In addition, it is possible to reduce pop noise in case in which power is ON and reduce a circuit size. In addition, by compensating for an offset voltage in advance, it is possible to prevent a voltage of the output terminal of the output driver from being rapidly changed due to an offset.

Meanwhile, in response to the power ON, the output driver may operate after a ramp-ON operation of the first switching device. Accordingly, it is possible to reduce pop noise and harmonic distortion in case in which power is ON.

Meanwhile, after a level of the reference voltage output from the reference voltage output device increases in response to the power ON, a first gate driving signal input to a gate terminal of the first switching device may include a first level increase period in which the voltage increases to a first level, a first level maintaining period in which the first level is maintained, and a second level maintaining period in which a second level greater than the first level is maintained. Accordingly, it is possible to reduce pop noise and harmonic distortion in case in which power is ON. In addition, according to a leakage current, a falling level of the gate driving signal may be increased to the second level.

Meanwhile, during the first level maintaining period, a level of the compensation signal output from the pre-output driver may be less than a level of the audio output signal output from the output driver, and during the second level maintaining period, a level of the compensation signal output from the pre-output driver may be the same as the level of the audio output signal output from the output driver. Accordingly, it is possible to reduce pop noise and harmonic distortion in case in which power is ON.

Meanwhile, as the level of the reference voltage output from the reference voltage output device increases in response to the power ON, the level of the compensation signal output from the pre-output driver may increase. Accordingly, it is possible to reduce pop noise and harmonic distortion in case in which power is ON.

Meanwhile, the signal processing device and the image display apparatus having the same according to an embodiment of the present disclosure may further include a second switching device connected to an input terminal of an output driver, wherein after the first switching device is turned on in response to the power ON, the second switching device may be turned on and the differential signal may be transmitted to the amplifier, and the output driver may output the audio output signal based on an output signal from the amplifier output based on an amplification operation of the amplifier. Accordingly, it is possible to reduce pop noise and harmonic distortion in case in which power is ON. In addition, it is possible to reduce pop noise in case in which power is ON and reduce a circuit size.

Meanwhile, according to the ramp-ON of the second switching device, the output driver may operate. Accordingly, it is possible to reduce pop noise and harmonic distortion in case in which power is ON. In addition, it is possible to reduce pop noise in case in which power is ON and reduce a circuit size.

Meanwhile, a level of the reference voltage output from the reference voltage output device may increase in response to the power ON, and after the first switching device is turned on, a second gate driving signal input to a gate terminal of the second switching device may include a first level increase period in which the voltage increases to a first level, a first level maintaining period in which the first level is maintained, and a second level maintaining period in which a second level greater than the first level is maintained. Accordingly, it is possible to reduce pop noise and harmonic distortion in case in which power is ON. In addition, according to a leakage current, a falling level of the gate driving signal may be increased to the second level.

Meanwhile, the second level maintaining period of the second switching device may be longer than the second level maintaining period of the first switching device. Accordingly, it is possible to reduce pop noise and harmonic distortion in case in which power is ON.

Meanwhile, during the second level maintaining period of the second gate driving signal, the output driver may output a level-variable audio output signal, and during the first level maintaining period of the second gate driving signal, the output driver may not output the level-variable audio output signal. Accordingly, it is possible to reduce pop noise and harmonic distortion in case in which power is ON. In addition, it is possible to reduce pop noise in case in which power is ON and reduce a circuit size.

Meanwhile, the signal processing device and the image display apparatus having the same according to an embodiment of the present disclosure may further include an ON-OFF controller configured to output a driving control signal to each of the amplifier, the output driver, and the pre-output driver in case in which power is ON or in case in which power is OFF. Accordingly, it is possible to reduce pop noise and harmonic distortion in case in which power is ON. In addition, it is possible to reduce pop noise in case in which power is ON and reduce a circuit size.

Meanwhile, the signal processing device and the image display apparatus having the same according to an embodiment of the present disclosure may further include a first resistor disposed between the output driver and a first input terminal of the amplifier; and a second resistor disposed between the pre-output driver and a second input terminal of the amplifier. Accordingly, it is possible to reduce pop noise and harmonic distortion in case in which power is ON. In addition, it is possible to reduce pop noise in case in which power is ON and reduce a circuit size.

Meanwhile, the signal processing device and the image display apparatus having the same according to an embodiment of the present disclosure may further include: a first resistor disposed between the output driver and a first input terminal of the amplifier; and a second resistor and a third switching device disposed between the pre-output driver and a second input terminal of the amplifier. Accordingly, it is possible to reduce pop noise and harmonic distortion in case in which power is ON.

Meanwhile, the signal processing device and the image display apparatus having the same according to an embodiment of the present disclosure may further include: a reference voltage output device configured to output a reference voltage to a second input terminal, among a first input terminal and the second input terminal of the amplifier. Accordingly, it is possible to reduce pop noise and harmonic distortion in case in which power is ON.

Meanwhile, the signal processing device and the image display apparatus having the same according to an embodiment of the present disclosure may further include: a ramp signal generator configured to generate and output a ramp signal; and a fourth switching device disposed between the ramp signal generator and the first switching device and configured to perform switching for a first gate driving signal input to a gate terminal of the first switching device sequentially having a first level and a second level greater than the first level. Accordingly, it is possible to reduce pop noise and harmonic distortion in case in which power is ON. In addition, according to a leakage current, a falling level of the gate driving signal may be increased to the second level.

Meanwhile, the signal processing device and the image display apparatus having the same according to an embodiment of the present disclosure may further include: a ramp signal generator configured to generate and output a ramp signal; and a fifth switching device disposed between the ramp signal generator and the second switching device and configured to perform switching for a second gate driving signal input to a gate terminal of the second switching device sequentially having a first level and a second level greater than the first level. Accordingly, it is possible to reduce pop noise and harmonic distortion in case in which power is ON. In addition, according to a leakage current, a falling level of the gate driving signal may be increased to the second level.

DETAILED DESCRIPTION OF THE PREFERRED EMBODIMENTS

Hereinafter, the present disclosure will be described in detail with reference to the accompanying drawings.

With respect to constituent elements used in the following description, suffixes "module" and "unit" are given only in consideration of ease in the preparation of the specification, and do not have or serve as different meanings. Accordingly, the suffixes "module" and "unit" may be used interchangeably.

Figure 1:
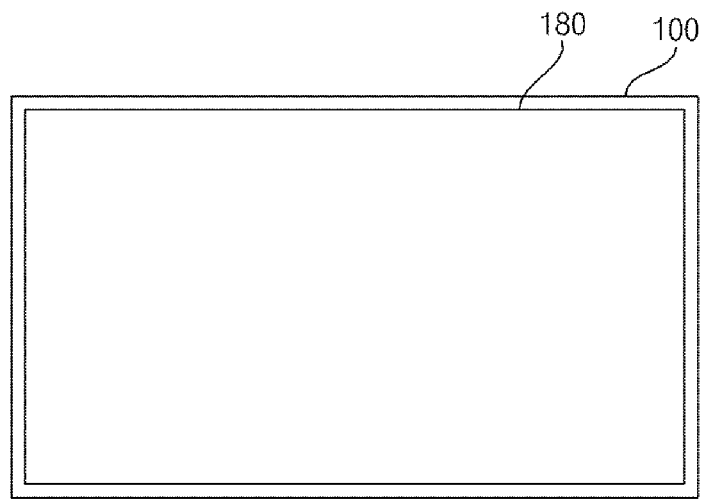
FIG. 1 is a diagram showing an image display apparatus according to an embodiment of the present disclosure.

FIG. 1 is a diagram showing an image display apparatus according to an embodiment of the present disclosure.

Referring to the drawing, an image display apparatus 100 according to an embodiment of the present disclosure may include a display 180.

Meanwhile, the display 180 may be implemented with any one of various panels. For example, the display 180 may be any one of a liquid crystal display panel (LCD panel), an organic light emitting diode panel (OLED panel), an inorganic light emitting diode panel (LED panel).

Meanwhile, the image display apparatus 100 in FIG. 1 may be a TV, a monitor, a tablet PC, a mobile terminal, a display for a vehicle, etc.

Figure 2:
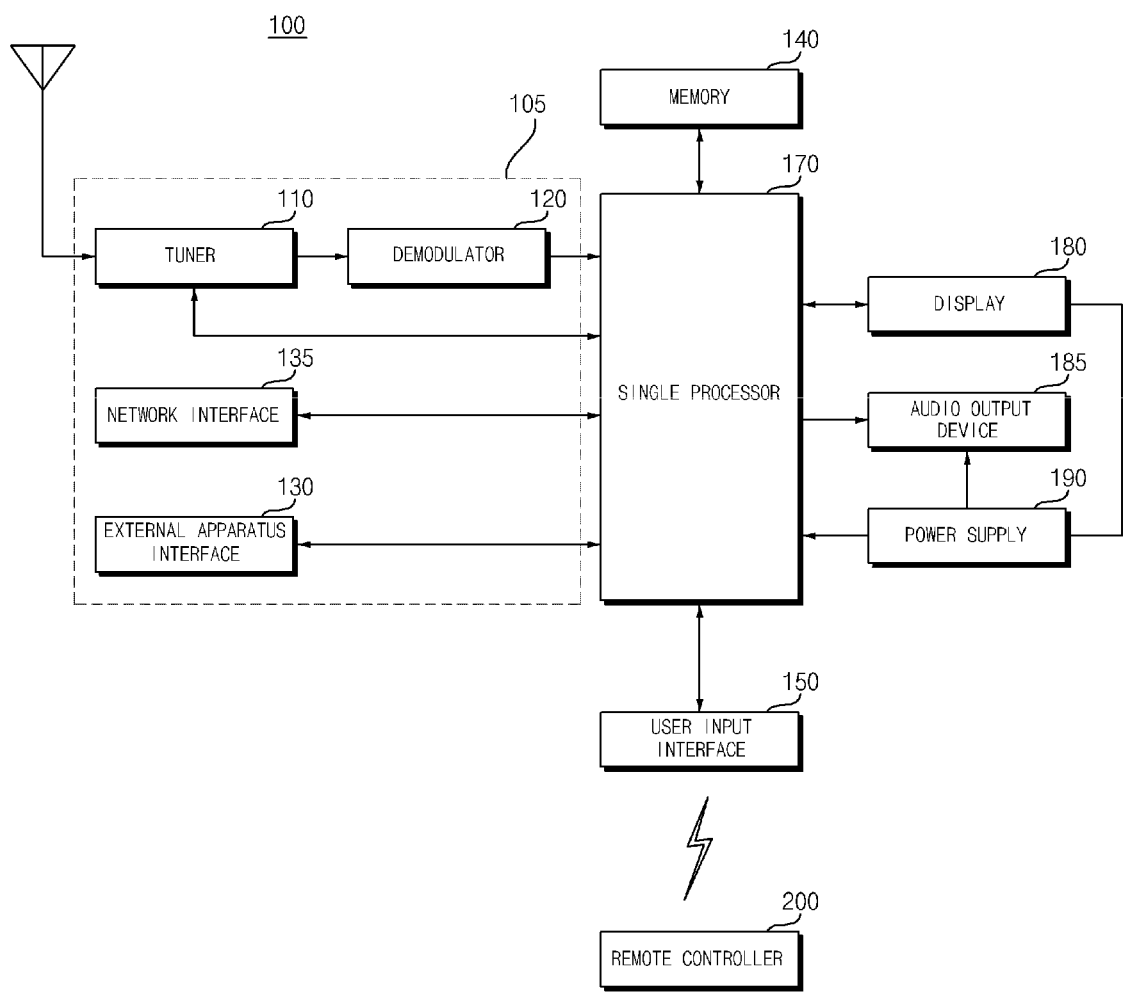
FIG. 2 is an example of an internal block diagram of the image display apparatus of FIG. 1.

FIG. 2 is an example of an internal block diagram of the image display apparatus of FIG. 1.

Referring to FIG. 2, the image display apparatus 100 according to an embodiment of the present disclosure includes an image receiver 105, an external apparatus interface 130, a memory 140, a user input interface 150, a sensor device (not shown), a signal processor 170, a display 180, and an audio output device 185.

The image receiver 105 may include a tuner 110, a demodulator 120, a network interface 135, and an external apparatus interface 130.

Meanwhile, unlike the drawing, the image receiver 105 may include only the tuner 110, the demodulator 120, and the external apparatus interface 130. That is, the network interface 135 may not be included.

The tuner 110 selects an RF broadcast signal corresponding to a channel selected by a user or all pre-stored channels among radio frequency (RF) broadcast signals received through an antenna (not shown). In addition, the selected RF broadcast signal is converted into an intermediate frequency signal, a baseband image, or a audio signal.

For example, if the selected RF broadcast signal is a digital broadcast signal, it is converted into a digital IF signal (DIF). If the selected RF broadcast signal is an analog broadcast signal, it is converted into an analog baseband image or audio signal (CVBS/SIF). That is, the tuner 110 may process a digital broadcast signal or an analog broadcast signal. The analog baseband image or audio signal (CVBS/SIF) output from the tuner 110 may be directly input to the signal processor 170.

Meanwhile, the tuner 110 may include a plurality of tuners for receiving broadcast signals of a plurality of channels. Alternatively, a single tuner that simultaneously receives broadcast signals of a plurality of channels is also available.

The demodulator 120 receives the converted digital IF signal DIF from the tuner 110 and performs a demodulation operation.

The demodulator 120 may perform demodulation and channel decoding and then output a stream signal TS. At this time, the stream signal may be a multiplexed signal of an image signal, a audio signal, or a data signal.

The stream signal output from the demodulator 120 may be input to the signal processor 170. The signal processor 170 performs demultiplexing, image/audio signal processing, and the like, and then outputs an image to the display 180 and outputs audio to the audio output device 185.

The external apparatus interface 130 may transmit or receive data with a connected external apparatus (not shown), e.g., a set-top box 50. To this end, the external apparatus interface 130 may include an A/V input and output device (not shown).

The external apparatus interface 130 may be connected in wired or wirelessly to an external apparatus such as a digital versatile disk (DVD), a Blu ray, a game equipment, a camera, a camcorder, a computer (note book), and a set-top box, and may perform an input/output operation with an external apparatus.

The A/V input and output device may receive image and audio signals from an external apparatus. Meanwhile, a wireless transceiver (not shown) may perform short-range wireless communication with other electronic apparatus.

Through the wireless transceiver (not shown), the external apparatus interface 130 may exchange data with an adjacent mobile terminal 600. In particular, in a mirroring mode, the external apparatus interface 130 may receive device information, executed application information, application image, and the like from the mobile terminal 600.

The network interface 135 provides an interface for connecting the image display apparatus 100 to a wired/wireless network including the Internet network.

For example, the network interface 135 may receive various data or transmit various data to the outside through an Ethernet terminal network Meanwhile, the network interface 135 may include a wireless transceiver (not shown).

The memory 140 may store a program for each signal processing and control in the signal processor 170, and may store signal-processed image, audio, or data signal.

In addition, the memory 140 may serve to temporarily store image, audio, or data signal input to the external apparatus interface 130. In addition, the memory 140 may store information on a certain broadcast channel through a channel memory function such as a channel map.

Although FIG. 2 illustrates that the memory is provided separately from the signal processor 170, the scope of the present disclosure is not limited thereto. The memory 140 may be included in the signal processor 170.

The user input interface 150 transmits a signal input by the user to the signal processor 170 or transmits a signal from the signal processor 170 to the user.

For example, it may transmit/receive a user input signal such as power on/off, channel selection, screen setting, etc., from a remote controller 200, may transfer a user input signal input from a local key (not shown) such as a power key, a channel key, a volume key, a set value, etc., to the signal processor 170, may transfer a user input signal input from a sensor device (not shown) that senses a user's gesture to the signal processor 170, or may transmit a signal from the signal processor 170 to the sensor device (not shown).

The signal processor 170 may demultiplex the input stream through the tuner 110, the demodulator 120, the network interface 135, or the external apparatus interface 130, or process the demultiplexed signals to generate and output a signal for image or audio output.

For example, the signal processor 170 receives a broadcast signal received by the image receiver 105 or an HDMI signal, and perform signal processing based on the received broadcast signal or the HDMI signal to thereby output a processed image signal.

The image signal processed by the signal processor 170 is input to the display 180, and may be displayed as an image corresponding to the image signal. In addition, the image signal processed by the signal processor 170 may be input to the external output apparatus through the external apparatus interface 130.

The audio signal processed by the signal processor 170 may be output to the audio output device 185 as an audio signal. In addition, audio signal processed by the signal processor 170 may be input to the external output apparatus through the external apparatus interface 130.

Although not shown in FIG. 2, the signal processor 170 may include a demultiplexer, an image processor, and the like.

That is, the signal processor 170 may perform a variety of signal processing and thus it may be implemented in the form of a system on chip (SOC). This will be described later with reference to FIG. 3.

In addition, the signal processor 170 may control the overall operation of the image display apparatus 100. For example, the signal processor 170 may control the tuner 110 to control the tuning of the RF broadcast corresponding to the channel selected by the user or the previously stored channel.

In addition, the signal processor 170 may control the image display apparatus 100 based on a user command input through the user input interface 150 or an internal program.

Meanwhile, the signal processor 170 may control the display 180 to display an image. At this time, the image displayed on the display 180 may be a still image or a moving image, and may be a 2D image or a 3D image.

Meanwhile, the signal processor 170 may display a certain object in an image displayed on the display 180. For example, the object may be at least one of a connected web screen (newspaper, magazine, etc.), an electronic program guide (EPG), various menus, a widget, an icon, a still image, a moving image, or a text.

Meanwhile, the signal processor 170 may recognize the position of the user based on the image photographed by a photographing device (not shown). For example, the distance (z-axis coordinate) between a user and the image display apparatus 100 may be determined. In addition, the x-axis coordinate and the y-axis coordinate in the display 180 corresponding to a user position may be determined.

The display 180 generates a driving signal by converting an image signal, a data signal, an OSD signal, a control signal processed by the signal processor 170, an image signal, a data signal, a control signal, and the like received from the external apparatus interface 130.

Meanwhile, the display 180 may be configured as a touch screen and used as an input device in addition to an output device.

The audio output device 185 receives a signal processed by the signal processor 170 and outputs it as an audio.

The photographing device (not shown) photographs a user. The photographing device (not shown) may be implemented by a single camera, but the present disclosure is not limited thereto and may be implemented by a plurality of cameras. Image information photographed by the photographing device (not shown) may be input to the signal processor 170.

The signal processor 170 may sense a gesture of the user based on each of the images photographed by the photographing device (not shown), the signals detected from the sensor device (not shown), or a combination thereof.

The power supply 190 supplies corresponding power to the image display apparatus 100. Particularly, the power may be supplied to a controller 170 which may be implemented in the form of a system on chip (SOC), a display 180 for displaying an image, and an audio output device 185 for outputting an audio.

Specifically, the power supply 190 may include a converter for converting an AC power into a DC power, and a DC/DC converter for converting the level of the DC power.

The remote controller 200 transmits the user input to the user input interface 150. To this end, the remote controller 200 may use Bluetooth, a radio frequency (RF) communication, an infrared (IR) communication, an Ultra Wideband (UWB), ZigBee, or the like. In addition, the remote controller 200 may receive the image, audio, or data signal output from the user input interface 150, and display it on the remote controller 200 or output it as an audio.

Meanwhile, the image display apparatus 100 may be a fixed or mobile digital broadcasting receiver capable of receiving digital broadcasting.

Meanwhile, a block diagram of the image display apparatus 100 shown in FIG. 2 is a block diagram for an embodiment of the present disclosure. Each component of the block diagram may be integrated, added, or omitted according to a specification of the image display apparatus 100 actually implemented. That is, two or more components may be combined into a single component as needed, or a single component may be divided into two or more components. The function performed in each block is described for the purpose of illustrating embodiments of the present disclosure, and specific operation and apparatus do not limit the scope of the present disclosure.

Figure 3:
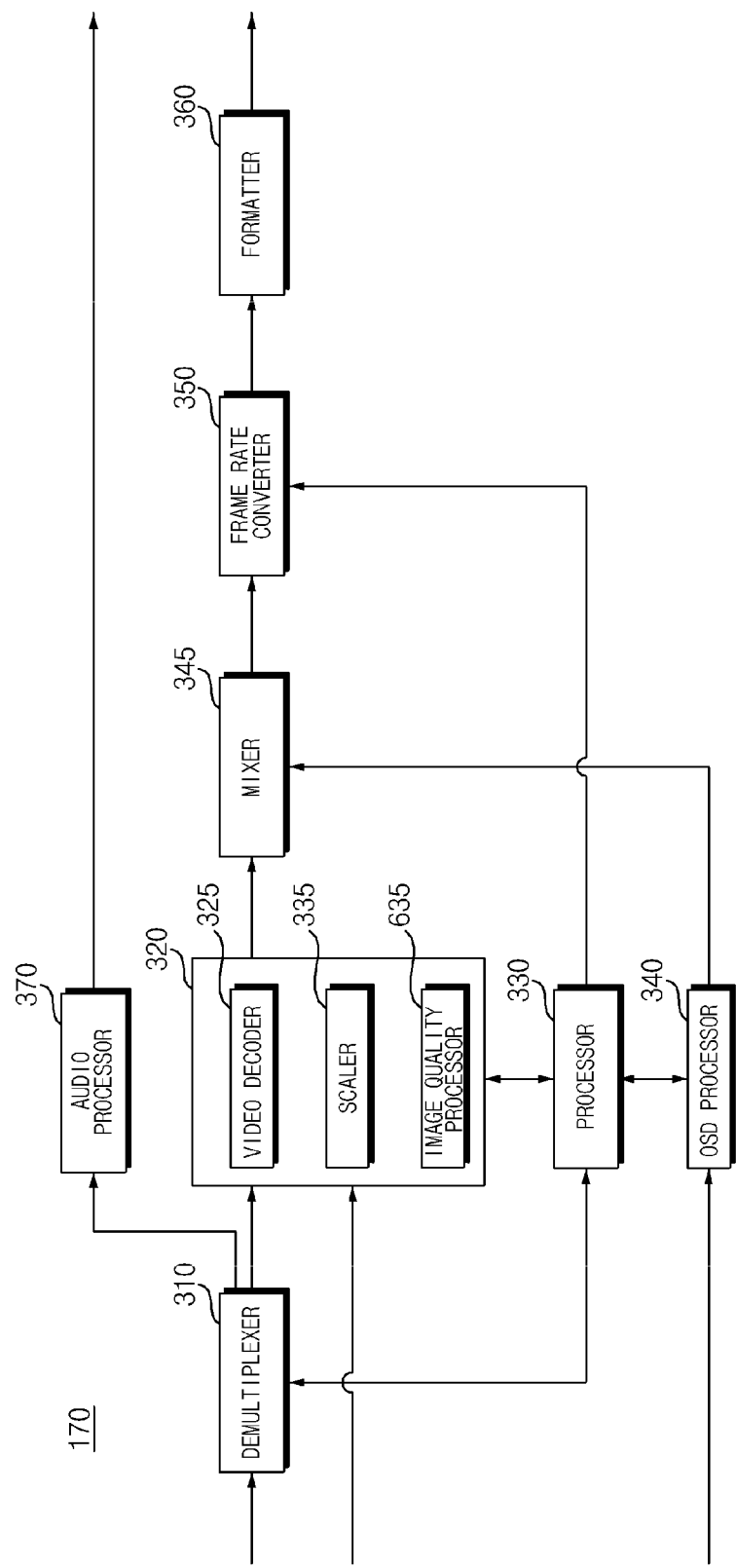
FIG. 3 is an example of an internal block diagram of a signal processor in FIG. 2.

FIG. 3 is an example of an internal block diagram of the signal processor in FIG. 2.

Referring to the drawing, the signal processor 170 according to an embodiment of the present disclosure may include a demultiplexer 310, an image processor 320, a processor 330, and an audio processor 370. In addition, the signal processor 170 may further include and a data processor (not shown).

The demultiplexer 310 demultiplexes the input stream. For example, when an MPEG-2 TS is input, it may be demultiplexed into image, audio, and data signal, respectively. Here, the stream signal input to the demultiplexer 310 may be a stream signal output from the tuner 110, the demodulator 120, or the external apparatus interface 130.

The image processor 320 may perform signal processing on an input image. For example, the image processor 320 may perform image processing on an image signal demultiplexed by the demultiplexer 310.

To this end, the image processor 320 may include an image decoder 325, a scaler 335, an image quality processor 635, an image encoder (not shown), an OSD processor 340, a frame rate converter 350, a formatter 360, etc.

The image decoder 325 decodes a demultiplexed image signal, and the scaler 335 performs scaling so that the resolution of the decoded image signal may be output from the display 180.

The image decoder 325 may include a decoder of various standards. For example, a 3D image decoder for MPEG-2, H.264 decoder, a color image, and a depth image, and a decoder for a multiple view image may be provided.

The scaler 335 may scale an input image signal decoded by the image decoder 325 or the like.

For example, if the size or resolution of an input image signal is small, the scaler 335 may upscale the input image signal, and, if the size or resolution of the input image signal is great, the scaler 335 may downscale the input image signal.

The image quality processor 635 may perform image quality processing on an input image signal decoded by the image decoder 325 or the like.

For example, the image quality processor 625 may perform noise reduction processing on an input image signal, extend a resolution of high gray level of the input image signal, perform image resolution enhancement, perform high dynamic range (HDR)-based signal processing, change a frame rate, perform image quality processing suitable for properties of a panel, especially an OLED panel, etc.

The OSD processor 340 generates an OSD signal based on a user input or by itself. For example, based on a user input signal, the OSD processor 340 may generate a signal for displaying various information as a graphic or a text on the screen of the display 180. The generated OSD signal may include various data such as a user interface screen of the image display apparatus 100, various menu screens, a widget, and an icon. In addition, the generated OSD signal may include a 2D object or a 3D object.

In addition, the OSD processor 340 may generate a pointer that may be displayed on the display, based on a pointing signal input from the remote controller 200. In particular, such a pointer may be generated by a pointing signal processor, and the OSD processor 340 may include such a pointing signal processor (not shown). Obviously, the pointing signal processor (not shown) may be provided separately from the OSD processor 340.

The mixer 345 may mix an OSD signal generated by the OSD processor 340 with a decoded image signal image-processed by the image processor 320. The mixed image signal is supplied to the frame rate converter 350.

Meanwhile, the formatter 360 may change a format of an input image signal into a format suitable for displaying the image signal on a display and output the image signal in the changed format.

In particular, the formatter 360 may change a format of an image signal to correspond to a display panel.

Meanwhile, the formatter 360 may change the format of the image signal. For example, it may change the format of the 3D image signal into any one of various 3D formats such as a side by side format, a top/down format, a frame sequential format, an interlaced format, a checker box format, and the like.

The processor 330 may control overall operations of the image display apparatus 100 or the signal processor 170.

For example, the processor 330 may control the tuner 110 to control the tuning of an RF broadcast corresponding to a channel selected by a user or a previously stored channel.

In addition, the processor 330 may control the image display apparatus 100 based on a user command input through the user input interface 150 or an internal program.

In addition, the processor 330 may transmit data to the network interface 135 or to the external apparatus interface 130.

In addition, the processor 330 may control the demultiplexer 310, the image processor 320, and the like in the signal processor 170.

Meanwhile, the audio processor 370 in the signal processor 170 may perform the audio processing of the demultiplexed audio signal. To this end, the audio processor 370 may include various decoders.

In addition, the audio processor 370 in the signal processor 170 may process a base, a treble, a volume control, and the like.

The data processor (not shown) in the signal processor 170 may perform data processing of the demultiplexed data signal. For example, when the demultiplexed data signal is a coded data signal, it may be decoded. The encoded data signal may be electronic program guide information including broadcast information such as a start time and an end time of a broadcast program broadcasted on each channel.

Meanwhile, a block diagram of the signal processor 170 shown in FIG. 3 is a block diagram for an embodiment of the present disclosure. Each component of the block diagram may be integrated, added, or omitted according to a specification of the signal processor 170 actually implemented.

In particular, the frame rate converter 350 and the formatter 360 may be provided separately in addition to the image processor 320.

Meanwhile, an audio output signal processed by the audio processor 370 may be transmitted to a speaker in the audio output device 185 of FIG. 2.

Meanwhile, when the power of the audio processor 370 or the signal processor 170 is turned on, POP noise may occur. Pop noise reduction will be described with reference to FIG. 4A and following drawings.

Figure 4A:
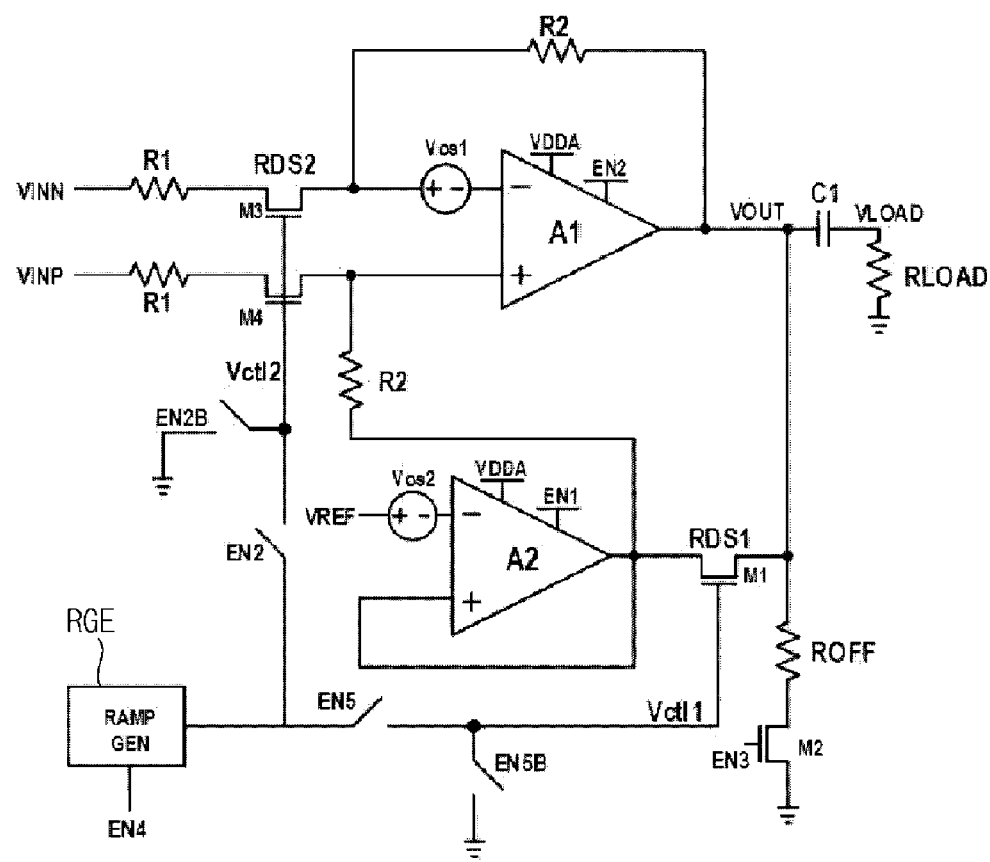
FIGS. 4A to 4C are circuit diagrams illustrating a signal processing device according to the present disclosure.
Figure 4B:
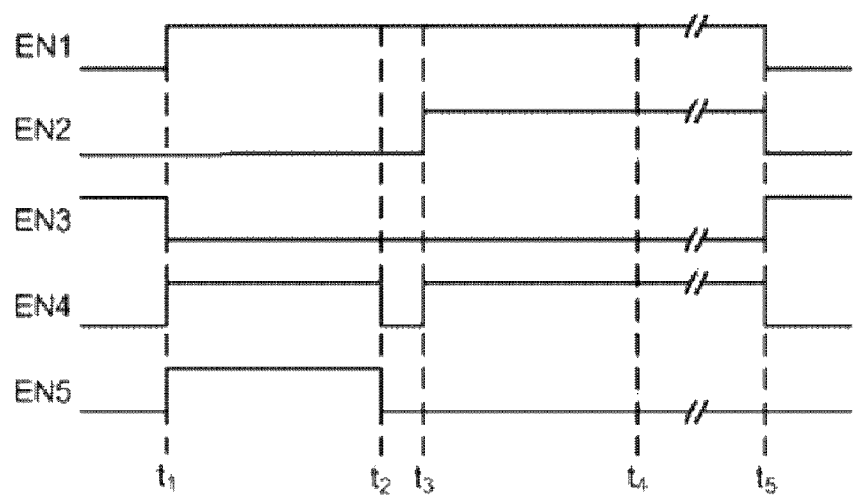
Figure 4C:
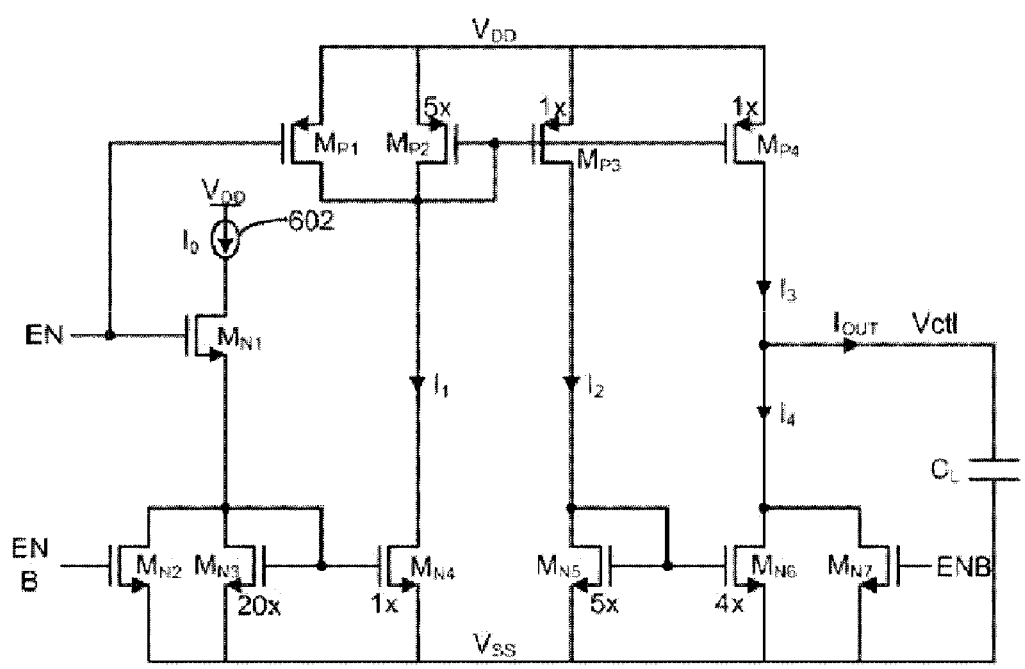

FIGS. 4A to 4C are circuit diagrams illustrating a signal processing device according to the present disclosure.

First, FIG. 4A illustrates a signal processing device 400 for reducing pop noise related to the present disclosure.

Referring to the drawings, the signal processing device 400 according to the present disclosure includes an amplifier A1 that performs amplification based on a differential signal between a first input terminal VINN and a second input terminal VINP, a buffer A2 for buffering a reference voltage VREF, and a ramp generator RGE for outputting a ramp signal.

Meanwhile, the output of the buffer A2 is used to remove pop noise.

Meanwhile, according to the ramp signal output from the ramp generator RGE, a gate voltage of a M1 transistor is gradually increased, and accordingly, a change in ON-resistance Ron is slowed.

Meanwhile, a voltage load VLOAD of a coupling capacitor C1 provided in the audio output device 185 is initially a ground voltage by a coupling resistor RLOAD, and is gradually increased to the reference voltage VREF according to the ramp signal output from the ramp generator RGE.

That is, in case in which power is turned on or off, a voltage of the output of the amplifier A1 is gradually increased from the ground voltage to the reference voltage VREF.

Meanwhile, although the coupling capacitor C1 and the coupling resistor RLOAD provided in the audio output device 185 operate as a high-pass filter, the voltage of the output of the amplifier A1 is gradually increased based on the ramp signal output from the ramp generator RGE, so that VLOAD does not change rapidly. Accordingly, pop noise may be reduced.

Meanwhile, FIG. 4B is a diagram showing operation control signals of the amplifier A1, the buffer A2, and the ramp generator RGE of FIG. 4A.

Meanwhile, FIG. 4C is an example of an internal circuit diagram of the ramp generator RGE of FIG. 4A.

Referring to FIG. 4C, the ramp generator RGE includes a current generator 602, p-channel FETs MP1 to MP4, n-channel FETs MN1 to MN7, and a capacitor CL.

Sources of the p-channel FETs MP1 to MP4 are electrically coupled to a positive power supply rail Vdd, and gates of the p-channel FETs MP2 to MP4 are electrically coupled to drains of the p-channel FETs MP1 and MP2 and to a drain of the n-channel FET MN4.

A gate of the p-channel FET MP1 is electrically coupled to a gate of the n-channel FET MN1, both are configured to receive a control signal EN.

The drain of the p-channel FET MP3 is electrically coupled to a drain of the n-channel FET MN5 and to gates of the n-channel FETs MN5 and MN6. The drain of the p-channel FET MP4 is electrically coupled to the drains of the n-channel FETs MN6 and MN7 and to a first end of the capacitor CL.

A current generator 602 is coupled between a positive supply rail Vdd and the drain of the n-channel FET MN1. The source of n-channel FET MN1 is electrically coupled to the drains of n-channel FETs MN2 and MN3 and the gates of n-channel FETs MN3 and MN4. The gates of the n-channel FETs MN2 and MN7 are configured to receive a control signal ENB (e.g., a complement of the control signal EN). A second end of the capacitor CL, as well as the drains of the n-channel FETs MN2 to MN7, is electrically coupled to a negative power rail Vss, which may be at a ground potential.

In operation, the ramp generator 600 is disabled when the control signal EN is at a low logic level and the control signal ENB is at a high logic level. The control signal EN at a low logic level turns off the n-channel FET MN1 to prevent current from flowing through the n-channel FET MN4 due to a mirror configuration thereof with the n-channel FET MN3. Also, the control signal EN at a low logic level turns on the p-channel FET MP1, which couples Vdd to the gates of the p-channel FETs MP2 to MP4 to turn them off. The control signal ENB at a high logic level turns on the n-channel FETs MN2 and MN7 to ground the drain of each of the n-channel FETs MN3, MN4, MN5 and MN6 to reduce or eliminate leakage through these transistors. Accordingly, currents I0 through I4 are substantially 0 when ramp generator 600 is disabled.

When the control signal EN transitions to a high logic level and the control signal ENB transitions to a low logic level, the ramp generator 600 is enabled. The control signal EN at a high logic level turns on the n-channel FET MN1 and turns off the p-channel FET MP1. A control signal ENB at a low logic level turns off MN2 and MN7. Turning on of the n-channel FET MN1 electrically couples the current source 602 to the drain of n-channel FET MN3, and turning off of the transistor MN2 removes a short-circuit or bypassing of the n-channel FET MN3. This allows current I0 to flow from the current source 602 to the Vss rail through n-channel FETs MN1 and MN3. This current also allows the n-channel FET MN4 to conduct current I1.

Meanwhile, in FIG. 4A, since a dc output of the amplifier A1 and a dc output of the buffer A2 are not the same, a voltage of the output terminal VOUT of the amplifier A1 may be rapidly changed in case in which power is turned on.

In the case of t1 in FIG. 4B, the voltage of the output terminal VOUT may be a ground voltage.

Next, in the case of t2 in FIG. 4B, the voltage of the output terminal VOUT may be expressed by Equation 1 below.

$$VOUT_{(t2)} = VREF + Vos2 \qquad \text{[Equation 1]}$$

Next, in the case of t3 in FIG. 4B, the voltage of the output terminal VOUT may be expressed by Equation 2 below.

$$VOUT_{(t3)} = VREF + Vos2 + \left(\frac{R2}{R1} + 1\right) \cdot Vos1 \qquad \text{[Equation 2]}$$

Meanwhile, in the case of t4 in FIG. 4B, the voltage of the output terminal VOUT may be expressed by Equation 3 below.

$$VOUT_{(t4)} = \qquad \text{[Equation 3]}$$
$$VREF + Vos2 + \left(\frac{R2}{R1} + 1\right) \cdot Vos1 + 2 \cdot Ampl \cdot \frac{R2}{R1} + \frac{R2}{R1} \cdot Vos3$$

Combining Equations 1 to 3, between t2 and t3, the dc output of the amplifier A1 and the dc output of the buffer A2 are not the same, and thus, pop noise may occur.

Specifically, at t2, the rapid change is suppressed by the ramp generator RGE and the M1 switch, but at t3, as the amplifier A1 is turned on, the operation of Vos1 is added, so the voltage of the output terminal VOUT changes rapidly. As a result, pop noise occurs.

Meanwhile, at t4, a normal operation is performed, and a rapid change is limited by Vctl2, the switch M3, and the switch M4.

Meanwhile, when the transistors of the switch M3 and the switch M4 disposed at the input terminal of the amplifier A1 have a large size, harmonic distortion THD may be reduced.

However, when the size of the transistors of the switch M3 and the switch M4 increases, the voltage at the output terminal VOUT rapidly changes, so that pop noise occurs.

Meanwhile, a leakage problem of Mnos of the switch MM6 and switch MM7 in the ramp generator RGE of FIG. 4c arises, so the output current Iout of the ramp generator RGE may not be properly generated.

In addition, the voltage Vctl of FIG. 4C is not increased to Vdd, and accordingly, resistance Rds of the switch M3, the switch M4, and the switch M1 increases. That is, the drain-source resistance of the switch M3, the switch M4, and the switch M1 increases.

In order to solve the problems of FIGS. 4A to 4C, the present disclosure proposes a signal processing device capable of reducing pop noise and harmonic distortion in case in which power is turned on. In addition, the present disclosure proposes a signal processing device with reduced pop noise and reduced circuit size in case in which power is turned on. This will be described with reference to FIG. 5 and the following drawings.

Figure 5:
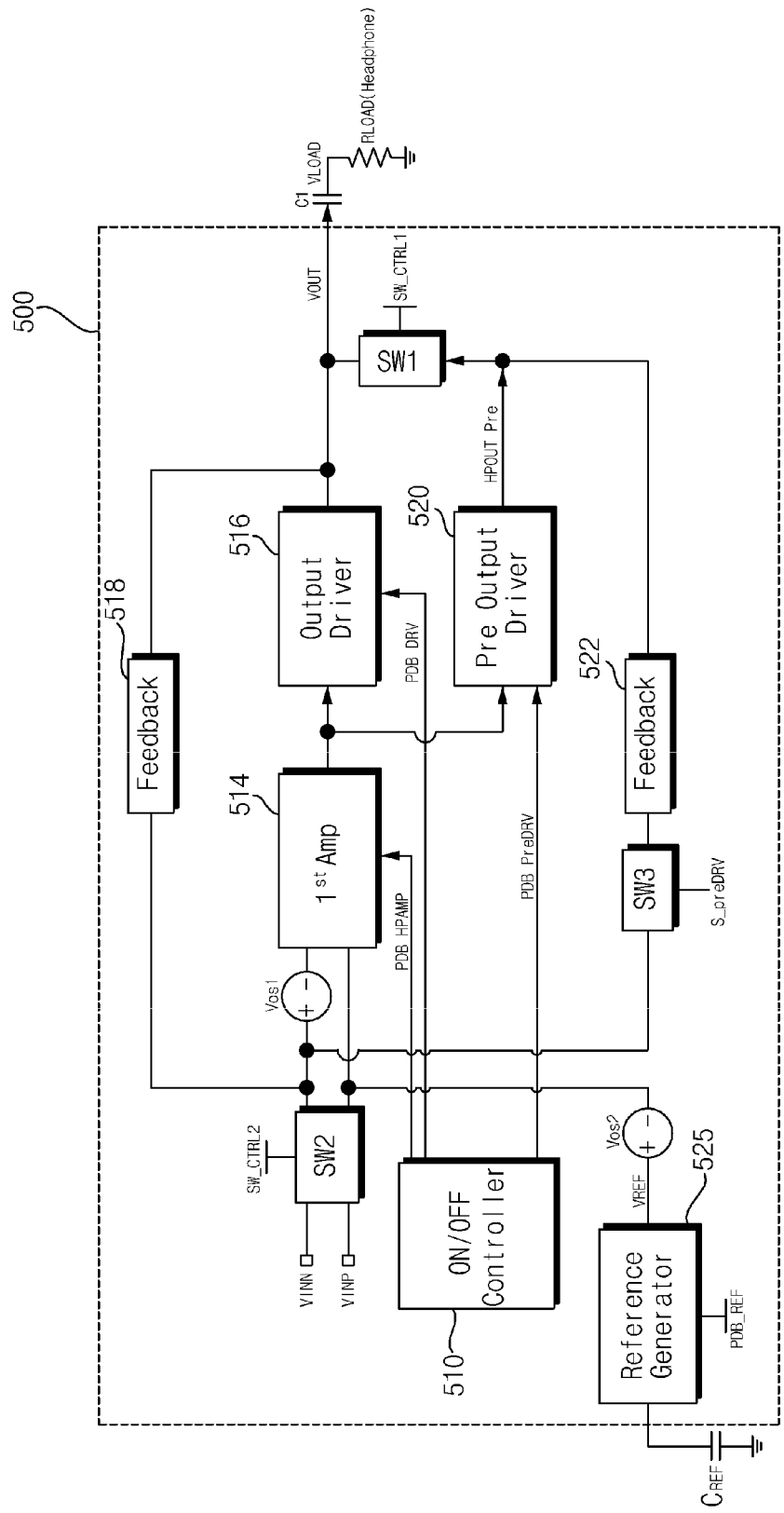
FIG. 5 is a circuit diagram illustrating a signal processing device according to an embodiment of the present disclosure.

FIG. 5 is a circuit diagram illustrating a signal processing device according to an embodiment of the present disclosure.

Referring to FIG. 5, a signal processing device 500 according to an embodiment of the present disclosure includes an amplifier 514 performing amplification based on an input differential signal, an output driver 516 outputting an audio output signal VOUT based on an output signal from the amplifier 514, a reference voltage output device 525 outputting a reference voltage VREF in case in which power is turned on, a pre-output driver 520 compensating for an offset voltage in advance based on an output signal from the amplifier 514 and outputting a compensation signal HPOUT_pre after the power is turned on, and a first switching device SW1 disposed between an output terminal of the output driver 516 and an output terminal of the pre-output driver 520, and after the first switching device SW1 is turned on after the power is ON, the output driver 516 operates.

Meanwhile, the audio output signal VOUT of FIG. 5 may be output to a coupling capacitor C1 and a coupling resistor RLOAD provided in the audio output device 185.

Unlike FIG. 4A or the like, the audio output signal VOUT is not fed back and used as a reference voltage, but an offset (e.g., Vos1, Vos2) is reflected in advance using the pre-output driver 520, so that the audio output signal VOUT does not change rapidly by the offset.

Accordingly, it is possible to reduce pop noise and harmonic distortion in case in which power is turned on. In addition, it is possible to reduce pop noise in case in which power is ON and reduce a circuit size. In addition, by compensating the offset voltage in advance, it is possible to prevent the voltage at the output terminal of the output driver 516 from being rapidly changed due to the offset.

Meanwhile, in response to power ON, the output driver 516 may operate after a ramp-ON operation of the first switching device SW1. Accordingly, it is possible to reduce pop noise and harmonic distortion in case in which power is turned on.

Meanwhile, the signal processing device 500 according to an embodiment of the present disclosure may further include a second switching device SW2 connected to the input terminal of the output driver 516, and after the first switching device SW1 is turned on in response to the power ON, the second switching device SW2 may be turned on and a differential signal may be transmitted to the amplifier 514, and the output driver 516 may output the audio output signal VOUT based on an output signal from the amplifier 514 output according to the amplification operation of the amplifier 514.

Accordingly, it is possible to reduce pop noise and harmonic distortion in case in which power is turned on. In addition, it is possible to reduce pop noise in case in which power is turned on and reduce a circuit size.

In particular, by the second switching device SW2, the occurrence of pop noise due to the offset between a first input terminal VINN may be prevented and an ON resistance Ron when an input voltage is transmitted may be lowered to improve total harmonic distortion THD.

Meanwhile, according to the ramp-ON of the second switching device SW2, the output driver 516 may operate. Accordingly, it is possible to reduce pop noise and harmonic distortion in case in which power is turned on. In addition, it is possible to reduce pop noise in case in which power is turned on and reduce a circuit size.

Meanwhile, the signal processing device 500 according to an embodiment of the present disclosure may further include an ON/OFF controller 510 outputting a driving control signal in each of the amplifier 514, the output driver 516, and the pre-output driver 520 in case in which power is turned on or off. Accordingly, it is possible to reduce pop noise and harmonic distortion in case in which power is turned on. In addition, it is possible to reduce pop noise in case in which power is turned on and reduce a circuit size.

Meanwhile, the signal processing device 500 according to an embodiment of the present disclosure may further include a first feedback circuit 518 disposed between the output driver 516 and the first input terminal of the amplifier 514 and a second feedback circuit 522 disposed between the pre-output driver 520 and the first input terminal of the amplifier 514. Accordingly, it is possible to reduce pop noise and harmonic distortion in case in which power is turned on.

The first feedback circuit 518 may include a first resistor R2a, a second feedback circuit 522, and a second resistor R2b.

Meanwhile, the signal processing device 500 according to an embodiment of the present disclosure may further include a first feedback circuit 518 disposed between the output driver 516 and the first input terminal of the amplifier 514 and a second feedback circuit 522 and a third switching device SW3 disposed between the pre-output driver 520 and the first input terminal of the amplifier 514. Accordingly, it is possible to reduce pop noise and harmonic distortion in case in which power is turned on.

Meanwhile, the signal processing device 500 according to an embodiment of the present disclosure may further include a reference voltage output device 525 outputting a reference voltage VREF to the second input terminal, among the first input terminal and the second input terminal of the amplifier 514. Accordingly, it is possible to reduce pop noise and harmonic distortion in case in which power is turned on.

Meanwhile, the signal processing device 500 of FIG. 5 may be provided in the signal processor 170 of FIG. 2. Alternatively, the signal processing device 500 of FIG. 5 may be provided in the audio processor 370 of FIG. 3.

Figure 6:
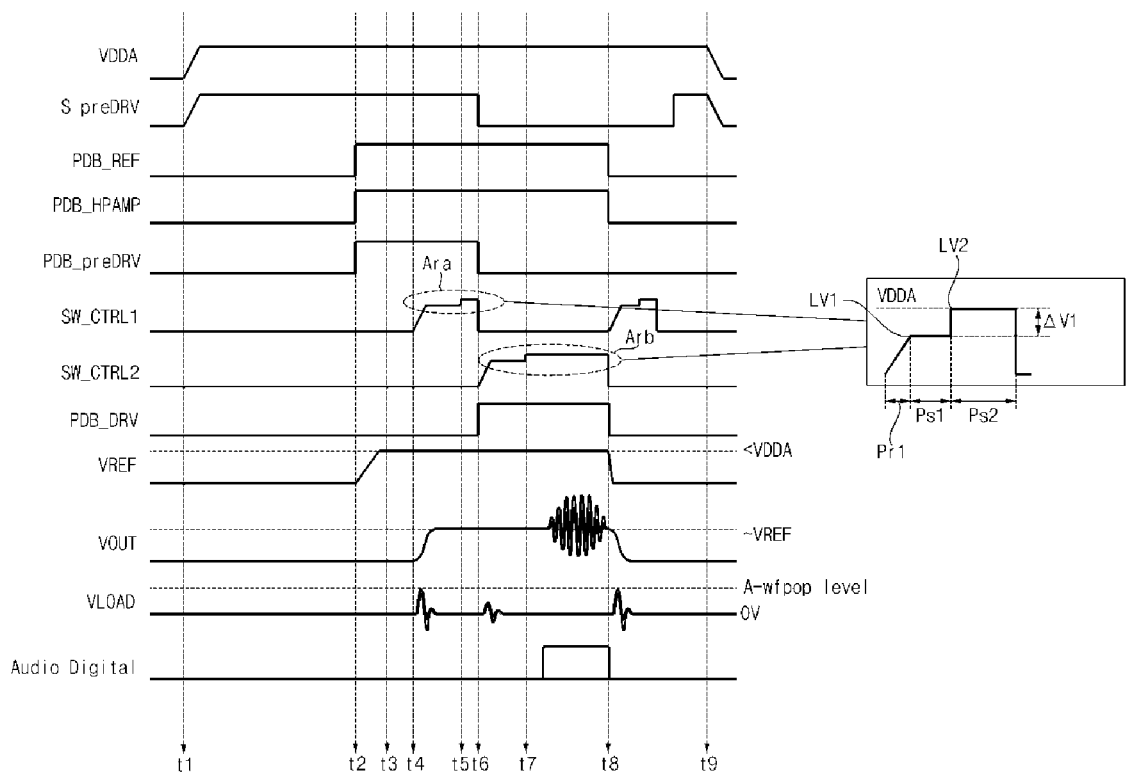
FIGS. 6 to 7B are diagrams referred to in the description of FIG. 5.
Figure 7A:
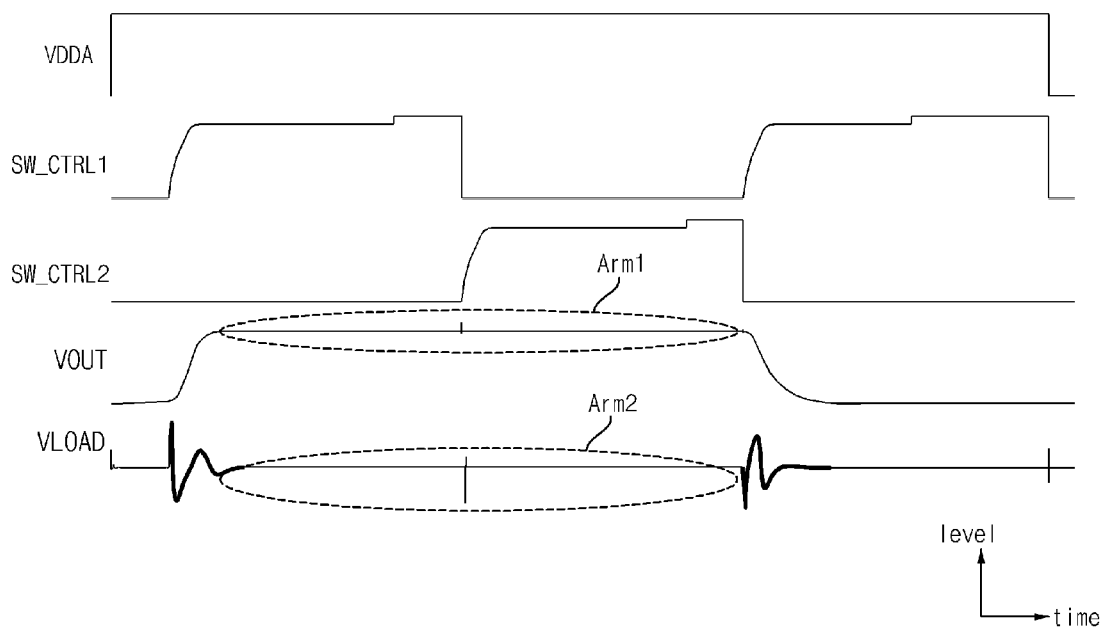
Figure 7B:
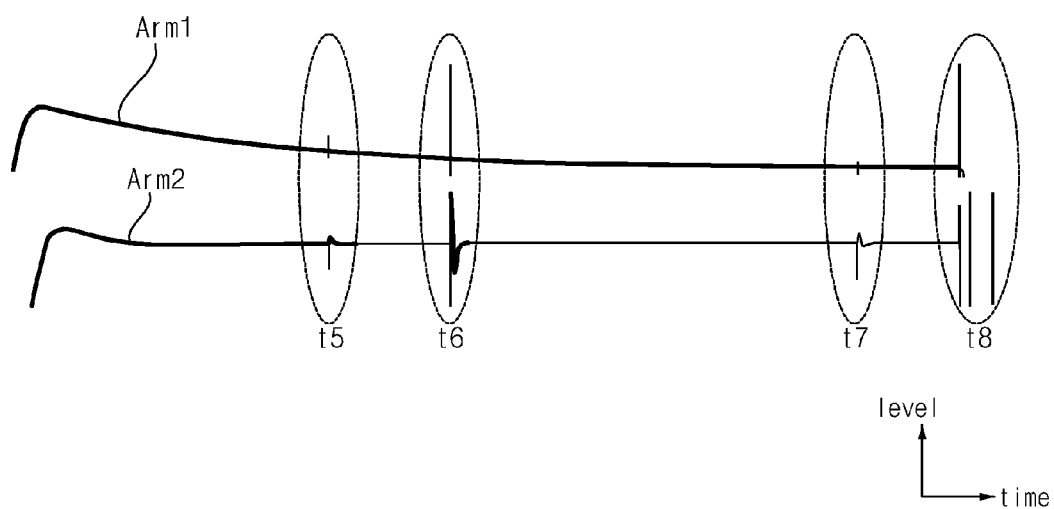

FIGS. 6 to 7B are diagrams referred to in the description of FIG. 5.

First, FIG. 6 is a diagram illustrating an operation waveform of each circuit element of the signal processing device 500 of FIG. 5.

Referring to FIG. 6, VDDA may represent operating power, S_preDRV may represent a gate driving signal of the third switching device SW3, PDB_REF may represent a driving control signal applied to the reference voltage output device 525, PDB_HPAMP may represent a driving control signal applied to the amplifier 514, PDB_preDRV may represent a driving control signal applied to the pre-output driver 520, SW_CTRL1 may represent a first gate driving signal applied to the first switching device SW1, SW_CTRL2 may represent a second gate driving signal applied to the second switching device SW2, PDB_DRV may represent a driving control signal applied to the output driver 516, VREF may represent a waveform of a reference voltage, VOUT may represent a waveform of an audio output signal, VLOAD may represent a voltage waveform of the coupling capacitor C1, and audio digital may represent an input differential signal.

Referring to FIG. 6, the power is turned on at t2, and before the power is turned on, at time t1, the levels of VDDA and S_preDRV are increased.

Next, in case in which power is turned on at t2, the levels of PDB_REF, PDB_HPAMP, and PDB_preDRV increases, and accordingly, the level of VREF are increased.

Meanwhile, after the level of the reference voltage output from the reference voltage output device 525 increases in response to the power ON at time t2, the first gate driving signal SW_CTRL1 input to a gate terminal of the first switching device SW1 may include a first level LV1 increase period in which the voltage increases to a first level, a first level maintaining period Ps1 in which the first level LV1 is maintained, and a second level maintaining period Ps2 in which a second level greater than the first level is maintained.

Between t4 and t5, the first level LV1 increase period Pr1 and the first level maintaining period Ps1 may be included, and between t5 and t6, the second level maintaining period Ps2 may be included.

In particular, by implementing the second level maintaining period Ps2 in which the second level LV2 is maintained, after the first level maintaining period Ps1, the point that the voltage cannot be increased to the VDDA voltage due to leakage is improved, so that the voltage may be increased to the VDDA voltage.

Accordingly, it is possible to reduce pop noise and harmonic distortion in case in which power is turned on. Also, the falling level of the gate driving signal may be increased to the second level LV2 according to the leakage current.

Meanwhile, during the first level maintaining period, a level of the compensation signal HPOUT_pre output from the pre-output driver 520 may be less than the level of the audio output signal VOUT output from the output driver 516, and during the second level maintaining period Ps2, the level of the compensation signal HPOUT_pre output from the pre-output driver 520 may be the same as the level of the audio output signal VOUT output from the output driver 516. Accordingly, it is possible to reduce pop noise and harmonic distortion in case in which power is turned on.

Meanwhile, in response to the power ON at time t2, the level of the compensation signal HPOUT_pre output from the pre-output driver 520 may increase as the level of the reference voltage output from the reference voltage output device 525 increases. Accordingly, it is possible to reduce pop noise and harmonic distortion in case in which power is turned on.

Meanwhile, as the power is turned on at time t2, the level of the reference voltage output from the reference voltage output device 525 increases, and after the first switching device SW1 is turned on, the second gate driving signal SW_CTRL2 input to the gate terminal of the second switching device SW2 includes a first level LV1 increase period in which the voltage increases to a first level, a first level maintaining period Ps1 in which the first level LV1 is maintained, and a second level maintaining period Ps2 in which a second level greater than the first level is maintained.

Between t6 and t7, the first level LV1 increase period Pr1 and the first level maintaining period Ps1 of the second gate driving signal SW_CTRL2 are included, and between t7 and t8, the second level maintaining period Ps2 of the second gate driving signal SW_CTRL2 may be included.

Accordingly, it is possible to reduce pop noise and harmonic distortion in case in which power is turned on. Also, the falling level of the gate driving signal may be increased to the second level LV2 according to a leakage current.

Meanwhile, the second level maintaining period Ps2 (t7 to t8) of the second switching device SW2 is longer than the second level maintaining period Ps2 (t5 to t6) of the first switching device SW1. Accordingly, it is possible to reduce pop noise and harmonic distortion in case in which power is turned on.

Meanwhile, during the second level maintaining period t7 to t8 of the second gate driving signal SW_CTRL2, the output driver 516 outputs a level-variable audio output signal VOUT, and during the first level maintaining period Ps1 (t6 to t7) of the second gate driving signal SW_CTRL2, the output driver 516 does not output the level-variable audio output signal VOUT.

Accordingly, it is possible to reduce pop noise and harmonic distortion in case in which power is turned on. In addition, it is possible to reduce pop noise in case in which power is turned on and reduce a circuit size.

Meanwhile, during t1 to t3 in FIG. 6, the voltage of the audio output signal VOUT may be a ground voltage.

Meanwhile, the audio output signal VOUT at t4 may be expressed by Equation 4 below.

$$VOUT_{(t4)} = VREF + Vos2 + A \cdot Vos1 \quad \text{[Equation 4]}$$

Meanwhile, during t5 to t7, the audio output signal VOUT may be equal to the level of the compensation signal HPOUT_pre.

Meanwhile, the audio output signal VOUT at t7 may be expressed by Equation 5 below.

$$VOUT_{(t7)} = VREF + Vos2 + A \cdot Vos1 + 2 \cdot Amp1 \cdot B + C \cdot Vos3 \quad \text{[Equation 5]}$$

FIG. 7A is a diagram illustrating waveforms of VDDA, SW_CTRL1, SW_CTRL2, VOUT, and VLOAD of FIG. 6.

Referring to the drawing, Arm1, which is a high-level section of VOUT, and Arm2, which is a high-level section of VLOAD, may be enlarged and displayed as shown in the waveforms of FIG. 7B.

Referring to FIG. 7B, in the Arm1 waveform, which is the high-level section of VOUT, and in the Arm2 waveform, which is the high-level section of VLOAD, some peaks appear at times t5, t6, t7, and t8, which, however, are a value within approximately several times the high level of VOUT or the high levels of VLOAD, irrelevant to the occurrence of pop noise.

Accordingly, according to the signal processing device 500 of FIG. 5 and the operation waveforms of FIG. 6 according to the embodiment of the present disclosure, it is possible to reduce pop noise and harmonic distortion in case in which power is turned on. In addition, it is possible to reduce pop noise in case in which power is turned on and reduce a circuit size.

Figure 8:
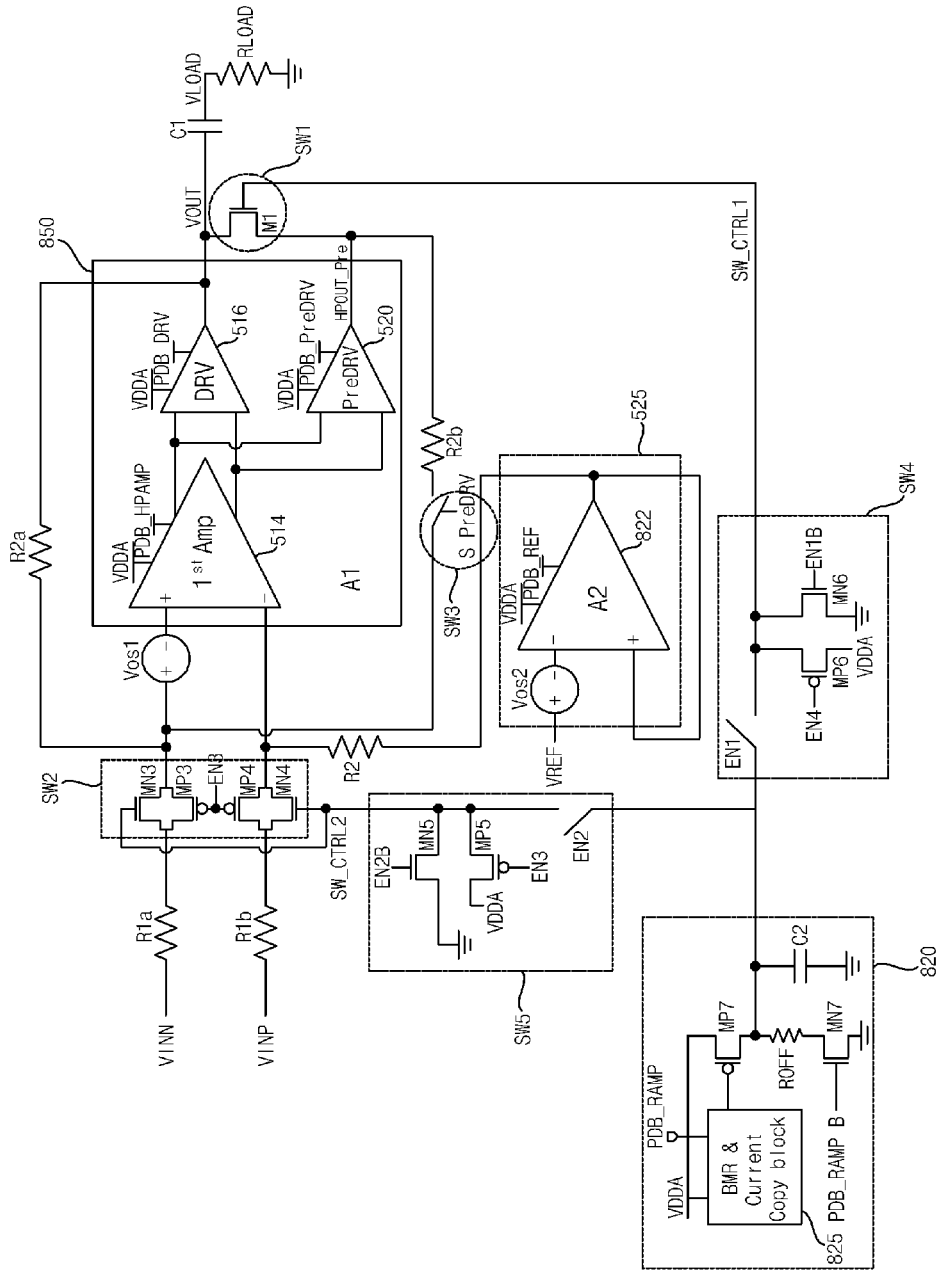
FIG. 8 is a circuit diagram illustrating a signal processing device according to another embodiment of the present disclosure.

FIG. 8 is a circuit diagram illustrating a signal processing device according to another embodiment of the present disclosure.

Referring to the drawing, a signal processing device 800 according to another embodiment of the present disclosure is similar to the signal processing device 500 of FIG. 5, but there is a difference in that the signal processing device 800 further includes a ramp signal generator 820 or the like.

The signal processing device 800 according to another embodiment of the present disclosure includes an amplifier 514 performing amplification based on an input differential signal, an output driver 516 outputting an audio output signal VOUT based on an output signal from the amplifier 514, a reference voltage output device 525 outputting a reference voltage VREF in case in which power is turned on, a pre-output driver 520 compensating for an offset voltage in advance based on an output signal from the amplifier 514 and outputting a compensation signal HPOUT_pre after power is turned on, and a first switching device SW1 disposed between an output terminal of the output driver 516 and an output terminal of the pre-output driver 520, wherein, after the first switching device SW1 is turned on, the output driver 516 operates.

Meanwhile, the audio output signal VOUT of FIG. 8 may be output to the coupling capacitor C1 and the coupling resistor RLOAD provided in the audio output device 185.

Meanwhile, the signal processing device 800 according to another embodiment of the present disclosure may further include a ramp signal generator 820 generating and outputting a ramp signal and a fourth switching device SW4 disposed between the ramp signal generator 820 and the first switching device SW1 and performing switching for the first gate driving signal SW_CTRL1 input to the gate terminal of the first switching device SW1 sequentially having the first level LV1 and the second level LV2 greater than the first level LV1. Accordingly, it is possible to reduce pop noise and harmonic distortion in case in which power is turned on. Also, the falling level of the gate driving signal may be increased to the second level LV2 according to a leakage current.

Meanwhile, the signal processing device 800 according to another embodiment of the present disclosure may further include a ramp signal generator 820 generating and outputting a ramp signal and a fourth switching device SW4 disposed between the ramp signal generator 820 and the first switching device SW1 and performing switching for the first gate driving signal SW_CTRL1 input to the gate terminal of the first switching device SW1 sequentially having the first level LV1 and the second level LV2 greater than the first level LV1. Accordingly, it is possible to reduce pop noise and harmonic distortion in case in which power is turned on. Also, the falling level of the gate driving signal may be increased to the second level LV2 according to a leakage current.

Unlike FIG. 4A or the like, the audio output signal VOUT is not fed back and used as a reference voltage, but an offset (e.g., Vos1, Vos2) is reflected in advance using the pre-output driver 520, so that the audio output signal VOUT does not change rapidly by the offset.

Accordingly, it is possible to reduce pop noise and harmonic distortion in case in which power is turned on. In addition, it is possible to reduce pop noise in case in which power is ON and reduce a circuit size. In addition, by compensating the offset voltage in advance, it is possible to prevent the voltage at the output terminal of the output driver 516 from being rapidly changed due to the offset.

Meanwhile, in response to power ON, the output driver 516 may operate after a ramp-ON operation of the first switching device SW1. Accordingly, it is possible to reduce pop noise and harmonic distortion in case in which power is turned on.

Meanwhile, the signal processing device 800 according to another embodiment of the present disclosure may further include a second switching device SW2 connected to the input terminal of the output driver 516, and after the first switching device SW1 is turned on in response to the power ON, the second switching device SW2 may be turned on and a differential signal may be transmitted to the amplifier 514, and the output driver 516 may output the audio output signal VOUT based on an output signal from the amplifier 514 output according to the amplification operation of the amplifier 514.

Accordingly, it is possible to reduce pop noise and harmonic distortion in case in which power is turned on. In addition, it is possible to reduce pop noise in case in which power is turned on and reduce a circuit size.

In particular, by the second switching device SW2, the occurrence of pop noise due to the offset between a first input terminal VINN may be prevented and an ON resistance Ron when an input voltage is transmitted may be lowered to improve total harmonic distortion THD.

Meanwhile, according to the ramp-ON of the second switching device SW2, the output driver 516 may operate. Accordingly, it is possible to reduce pop noise and harmonic distortion in case in which power is turned on. In addition, it is possible to reduce pop noise in case in which power is turned on and reduce a circuit size.

Meanwhile, the signal processing device 800 according to another embodiment of the present disclosure may further include a first resistor R2a disposed between the output driver 516 and the first input terminal of the amplifier 514 and a second resistor R2b disposed between the pre-output driver 520 and the first input terminal of the amplifier 514. Accordingly, it is possible to reduce pop noise and harmonic distortion in case in which power is turned on.

Meanwhile, the signal processing device 800 according to another embodiment of the present disclosure may further include a first resistor R2a disposed between the output driver 516 and the first input terminal of the amplifier 514 and a second resistor R2b and a third switching device SW3 disposed between the pre-output driver 520 and the first input terminal of the amplifier 514. Accordingly, it is possible to reduce pop noise and harmonic distortion in case in which power is turned on.

Meanwhile, the signal processing device 800 according to another embodiment of the present disclosure may further include a reference voltage output device 525 outputting a reference voltage VREF to the second input terminal, among the first input terminal and the second input terminal of the amplifier 514. Accordingly, it is possible to reduce pop noise and harmonic distortion in case in which power is turned on.

Meanwhile, the signal processing device 800 of FIG. 8 may be provided in the signal processor 170 of FIG. 2. Alternatively, the signal processing device 800 may be provided in the audio processor 370 of FIG. 3.

Figure 9:
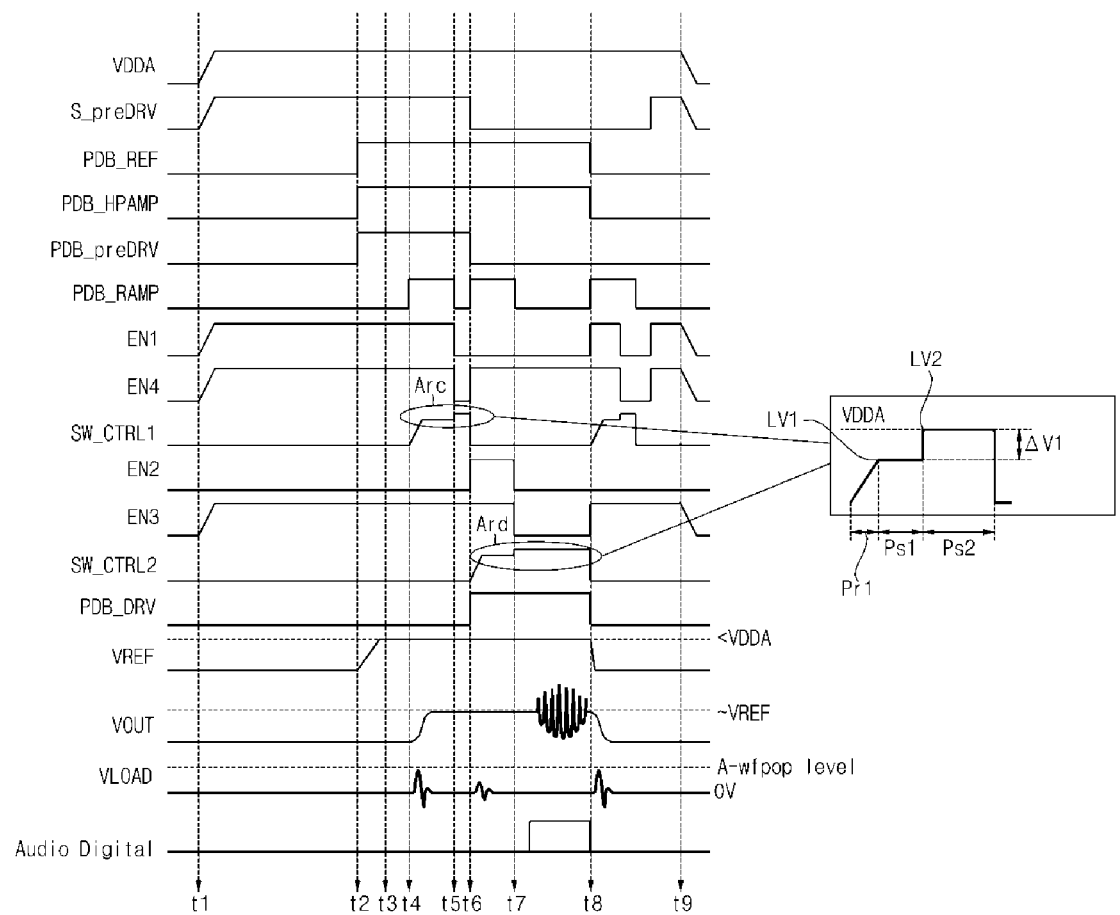
FIG. 9 is a diagram referred to in the description of FIG. 8.

FIG. 9 is a diagram illustrating an operation waveform of each circuit element of the signal processing device 800 of FIG. 8.

Referring to the drawing, VDDA may represent operating power, S_preDRV may represent a gate driving signal of the third switching device SW3, PDB_REF may represent a driving control signal applied to the reference voltage output device 525, PDB_HPAMP may represent a driving control signal applied to the amplifier 514, PDB_preDRV may represent a driving control signal applied to the pre-output driver 520, PDB_RAMP may represent a driving control signal applied to the pre-output driver 520 and represent a driving control signal applied to the ramp signal generator 820, EN1 may represent a driving waveform of the switch EN4, SW_CTRL1 may represent a first gate driving signal applied to the first switching device SW1, EN2 may represent a driving waveform of the switch EN2, EN3 may represent a driving waveform of the switch EN3, SW_CTRL2 may represent a second gate driving signal applied to the second switching device SW2, PDB_DRV may represent a driving control signal applied to the output driver 516, VREF may represent a waveform of a reference voltage, VOUT may represent a waveform of an audio output signal, VLOAD may represent a voltage waveform of the coupling capacitor C1, and audio digital may represent an input differential signal.

Referring to FIG. 9, the power is turned on at t2, and before the power is turned on, at time t1, the levels of VDDA and S_preDRV are increased.

Next, in case in which power is turned on at t2, the levels of PDB_REF, PDB_HPAMP, and PDB_preDRV are increased, and accordingly, the level of VREF increases.

Meanwhile, after the level of the reference voltage output from the reference voltage output device 525 increases in response to the power ON at time t2, the first gate driving signal SW_CTRL1 input to a gate terminal of the first switching device SW1 may include a first level LV1 increase period in which the voltage increases to a first level, a first level maintaining period Ps1 in which the first level LV1 is maintained, and a second level maintaining period Ps2 in which a second level greater than the first level is maintained.

Between t4 and t5, the first level LV1 increase period Pr1 and the first level maintaining period Ps1 may be included, and between t5 and t6, the second level maintaining period Ps2 may be included.

In particular, by implementing the second level maintaining period Ps2 in which the second level LV2 is maintained, after the first level maintaining period Ps1, the point that the voltage cannot be increased to the VDDA voltage due to leakage is improved, so that the voltage may be increased to the VDDA voltage.

Accordingly, it is possible to reduce pop noise and harmonic distortion in case in which power is turned on. Also, the falling level of the gate driving signal may be increased to the second level LV2 according to the leakage current.

Meanwhile, during the first level maintaining period, a level of the compensation signal HPOUT_pre output from the pre-output driver 520 may be less than the level of the audio output signal VOUT output from the output driver 516, and during the second level maintaining period Ps2, the level of the compensation signal HPOUT_pre output from the pre-output driver 520 may be the same as the level of the audio output signal VOUT output from the output driver 516. Accordingly, it is possible to reduce pop noise and harmonic distortion in case in which power is turned on.

Meanwhile, in response to the power ON at time t2, the level of the compensation signal HPOUT_pre output from the pre-output driver 520 may increase as the level of the reference voltage output from the reference voltage output device 525 increases. Accordingly, it is possible to reduce pop noise and harmonic distortion in case in which power is turned on.

Meanwhile, as the power is turned on at time t2, the level of the reference voltage output from the reference voltage output device 525 increases, and after the first switching device SW1 is turned on, the second gate driving signal SW_CTRL2 input to the gate terminal of the second switching device SW2 includes a first level LV1 increase period in which the voltage increases to a first level, a first level maintaining period Ps1 in which the first level LV1 is maintained, and a second level maintaining period Ps2 in which a second level greater than the first level is maintained.

Between t6 and t7, the first level LV1 increase period Pr1 and the first level maintaining period Ps1 of the second gate driving signal SW_CTRL2 are included, and between t7 and t8, the second level maintaining period Ps2 of the second gate driving signal SW_CTRL2 may be included.

Accordingly, it is possible to reduce pop noise and harmonic distortion in case in which power is turned on. Also, the falling level of the gate driving signal may be increased to the second level LV2 according to a leakage current.

Meanwhile, the second level maintaining period Ps2 (t7 to t8) of the second switching device SW2 is longer than the second level maintaining period Ps2 (t5 to t6) of the first switching device SW1. Accordingly, it is possible to reduce pop noise and harmonic distortion in case in which power is turned on.

Meanwhile, during the second level maintaining period t7 to t8 of the second gate driving signal SW_CTRL2, the output driver 516 outputs a level-variable audio output signal VOUT, and during the first level maintaining period Ps1 (t6 to t7) of the second gate driving signal SW_CTRL2, the output driver 516 does not output the level-variable audio output signal VOUT.

Accordingly, it is possible to reduce pop noise and harmonic distortion in case in which power is turned on. In addition, it is possible to reduce pop noise in case in which power is turned on and reduce a circuit size.

Meanwhile, during t1 to t3 in FIG. 9, the voltage of the audio output signal VOUT may be a ground voltage.

Meanwhile, the audio output signal VOUT at t4 may be expressed by Equation 6 below.

$$VOUT_{(t4)} = VREF + Vos2 + \left(\frac{R2}{R1} + 1\right) \cdot Vos1 \quad \text{[Equation 6]}$$

Here, R1 may represent the same case as R1a and R1b, and R2 may represent the same case as R2a and R2b.

Meanwhile, from t5 to t7, the audio output signal VOUT may be equal to the level of the compensation signal HPOUT_pre.

Meanwhile, the audio output signal VOUT at t7 may be expressed by Equation 7 below.

$$VOUT_{(t7)} = \\ VREF + Vos2 + \left(\frac{R2}{R1} + 1\right) \cdot Vos1 + 2 \cdot Ampl \cdot \frac{R2}{R1} + \frac{R2}{R1} \cdot Vos3 \quad \text{[Equation 7]}$$

Here, R1 may represent the same case as Ria and R1b, and R2 may represent the same case as R2a and R2b.

Figure 10:
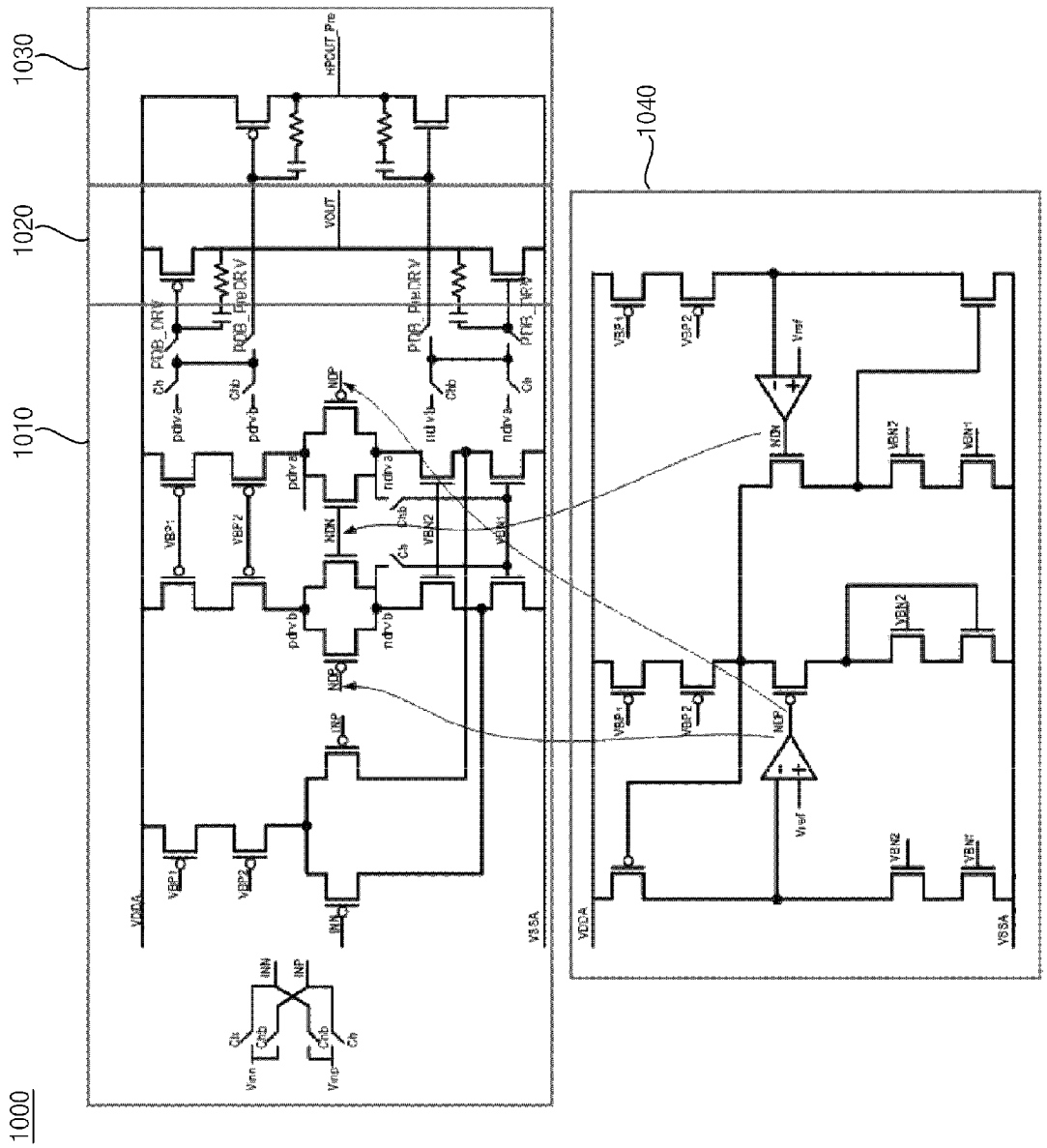
FIG. 10 is a circuit diagram illustrating a signal processing device according to another embodiment of the present disclosure.

FIG. 10 is a circuit diagram illustrating a signal processing device according to another embodiment of the present disclosure.

Referring to the drawing, a signal processing device 1000 according to another embodiment of the present disclosure may include an amplifier 1010 performing amplification based on an input differential signal, an output driver 1020 outputting the audio output signal VOUT based on an output signal from the amplifier 1010, and a pre-output driver 1030 compensating for an offset voltage in advance and outputting a compensation signal HPOUT_pre based on an output signal from the amplifier 514 after power is turned on.

In particular, the amplifier 1010, the output driver 1020, and the pre-output driver 1030 in the signal processing device 1000 may be implemented on the same circuit board.

Meanwhile, the amplifier 1010 of FIG. 10 may be implemented by a current circuit 1040.

While the present disclosure has been particularly shown and described with reference to exemplary embodiments thereof, it is clearly understood that the present disclosure is not limited to the specific embodiment described above, and various modifications are available to those ordinary skilled in the art without departing from the subject matter claimed in the accompanying claims. Further, the various modifications should not be individually understood from the technical concept or prospect of the present disclosure.

What is claimed is:

1. A signal processing device for outputting an audio output signal by signal processing, the signal processing device comprising:
    an amplifier configured to perform amplification based on an input differential signal;
    an output driver configured to output an audio output signal based on an output signal from the amplifier;
    a reference voltage output device configured to output a reference voltage in response to power ON;
    a pre-output driver configured to pre-compensate for an offset voltage and output a compensation signal, based on an output signal from the amplifier after the power ON; and
    a first switching device disposed between an output terminal of the output driver and an output terminal of the pre-output driver,
    wherein the output driver operates after the first switching device is turned on in response to the power ON, and
    wherein after a level of the reference voltage output from the reference voltage output device increases in response to the power ON, a first gate driving signal input to a gate terminal of the first switching device includes a first level increase period for the first switching device in which a level of the first gate driving signal increases to a first level of the first gate driving signal, a first level maintaining period for the first switching device in which the first level of the first gate driving signal is maintained, and a second level maintaining period for the first switching device in which a second level of the first gate driving signal greater than the first level of the first gate driving signal is maintained.

2. The signal processing device of claim 1, wherein in response to the power ON, the output driver operates after a ramp-ON operation of the first switching device.

3. The signal processing device of claim 2, further comprising:
    a ramp signal generator configured to generate and output a ramp signal; and
    a fourth switching device disposed between the ramp signal generator and the first switching device.

4. The signal processing device of claim 1, wherein
    during the first level maintaining period for the first switching device, a level of the compensation signal output from the pre-output driver is less than a level of the audio output signal output from the output driver, and
    wherein during the second level maintaining period for the first switching device the level of the compensation signal output from the pre-output driver is same as the level of the audio output signal output from the output driver.

5. The signal processing device of claim 1, wherein as the level of the reference voltage output from the reference voltage output device increases in response to the power ON, a level of the compensation signal output from the pre-output driver increases.

6. The signal processing device of claim 1, further comprising:
    a second switching device connected to an input terminal of the output driver,
    wherein after the first switching device is turned on in response to the power ON, the second switching device is turned on and the differential signal is transmitted to the amplifier, and the output driver outputs the audio output signal based on an output signal from the amplifier output based on an amplification operation of the amplifier.

7. The signal processing device of claim 6, wherein the output driver operates in response to ramp-ON of the second switching device.

8. The signal processing device of claim 7, further comprising:
a ramp signal generator configured to generate and output a ramp signal; and
a fifth switching device disposed between the ramp signal generator and the second switching device.

9. The signal processing device of claim 6, wherein a level of the reference voltage output from the reference voltage output device increases in response to the power ON, and
wherein after the first switching device is turned on, a second gate driving signal input to a gate terminal of the second switching device includes a first level increase period for the second switching device in which a level of the second gate driving signal increases to a first level of the second gate driving signal, a first level maintaining period for the second switching device in which the first level of the second gate driving signal is maintained, and a second level maintaining period for the second switching device in which a second level of the second gate driving signal greater than the first level of the second gate driving signal is maintained.

10. The signal processing device of claim 9, wherein the second level maintaining period of the second switching device is longer than the second level maintaining period of the first switching device.

11. The signal processing device of claim 9, wherein during the second level maintaining period of the second switching device, the output driver outputs a level-variable audio output signal, and
wherein during the first level maintaining period of the second switching device, the output driver does not output the level-variable audio output signal.

12. The signal processing device of claim 1, further comprising:
an ON-OFF controller configured to output a driving control signal to each of the amplifier, the output driver, and the pre-output driver in case in which power is ON or in case in which power is OFF.

13. The signal processing device of claim 1, further comprising:
a first resistor disposed between the output driver and a first input terminal of the amplifier; and
a second resistor disposed between the pre-output driver and a second input terminal of the amplifier.

14. The signal processing device of claim 1, further comprising:
a first resistor disposed between the output driver and a first input terminal of the amplifier; and
a second resistor and a third switching device disposed between the pre-output driver and a second input terminal of the amplifier.

15. The signal processing device of claim 1, wherein the reference voltage output device is configured to output the reference voltage to a second input terminal, among a first input terminal and the second input terminal of the amplifier.

16. An image display apparatus comprising:
a display; and
a signal processing device configured to output an audio output signal by signal processing,
wherein the signal processing device comprises:
an amplifier configured to perform amplification based on an input differential signal;
an output driver configured to output an audio output signal based on an output signal from the amplifier;
a reference voltage output device configured to output a reference voltage in response to power ON;
a pre-output driver configured to pre-compensate for an offset voltage and output a compensation signal, based on an output signal from the amplifier after the power ON; and
a first switching device disposed between an output terminal of the output driver and an output terminal of the pre-output driver,
wherein the output driver operates after the first switching device is turned on in response to the power ON, and
wherein after a level of the reference voltage output from the reference voltage output device increases in response to the power ON, a first gate driving signal input to a gate terminal of the first switching device includes a first level increase period for the first switching device in which a level of the first gate driving signal increases to a first level of the first gate driving signal, a first level maintaining period for the first switching device in which the first level of the first gate driving signal is maintained, and a second level maintaining period for the first switching device in which a second level of the first gate driving signal greater than the first level of the first gate driving signal is maintained.

17. The image display apparatus of claim 16, wherein the signal processing device further comprises a second switching device connected to an input terminal of an output driver,
wherein after the first switching device is turned on in response to the power ON, the second switching device is turned on and a differential signal is transmitted to the amplifier, and the output driver outputs the audio output signal based on an output signal from the amplifier output based on an amplification operation of the amplifier.

18. The image display apparatus of claim 16, wherein the signal processing device further comprises:
a ramp signal generator configured to generate and output a ramp signal; and
a fourth switching device disposed between the ramp signal generator and the first switching device.

* * * * *